United States Patent
Lee

(10) Patent No.: US 10,505,275 B2
(45) Date of Patent: Dec. 10, 2019

(54) SYSTEM AND METHOD FOR NEAR FIELD TEST OF ACTIVE ANTENNA SYSTEM (ASS)TRANSCEIVER

(71) Applicant: Keysight Technologies, Inc., Santa Rosa, CA (US)

(72) Inventor: Gregory S. Lee, Mountain View, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/975,523

(22) Filed: May 9, 2018

(65) Prior Publication Data

US 2019/0348760 A1   Nov. 14, 2019

(51) Int. Cl.

| | |
|---|---|
| *H01Q 3/26* | (2006.01) |
| *G01R 29/10* | (2006.01) |
| *G01R 31/28* | (2006.01) |
| *H04B 17/00* | (2015.01) |
| *H04W 24/06* | (2009.01) |
| *H04B 17/29* | (2015.01) |

(52) U.S. Cl.
CPC .......... *H01Q 3/267* (2013.01); *G01R 29/105* (2013.01); *G01R 31/2822* (2013.01); *H04B 17/0085* (2013.01); *H04B 17/29* (2015.01); *H04W 24/06* (2013.01)

(58) Field of Classification Search
CPC ........ H01Q 3/26; G01R 29/105; G01R 31/28; H04B 17/00; H04B 17/29

USPC ......................................................... 343/703
See application file for complete search history.

(56) References Cited

U.S. PATENT DOCUMENTS

| | | |
|---|---|---|
| 8,502,546 B2 | 8/2013 | Nyshadham et al. |
| 9,548,798 B2 | 1/2017 | Fritze et al. |
| 9,893,819 B1 | 2/2018 | Lee et al. |
| 2017/0279544 A1* | 9/2017 | Noda .................... H04B 17/102 |

FOREIGN PATENT DOCUMENTS

CN          104764938 A       7/2015

OTHER PUBLICATIONS

English Translation of CN104764938, pp. 1-6.
(Continued)

*Primary Examiner* — Andrea Lindgren Baltzell

(57) ABSTRACT

A system for testing a DUT having an AAS transceiver. The system includes a scanning array divided into first and partial scanning arrays including first and second probe antennas, respectively, the first partial scanning array determining a first portion and the second partial scanning array determining a second portion of a near field pattern of the DUT. A test transceiver receives an RF signal from the DUT via the scanning array while testing the DUT in a transmit mode. A processing unit selects a first reference probe antenna from the first probe antennas and a second reference probe antenna from the second probe antennas to provide reference signals, and to alternate between consecutively scanning first signals from the first probe antennas and comparing them to the second reference signal, and consecutively scanning second signals from the second probe antennas and comparing them to the first reference signal.

20 Claims, 5 Drawing Sheets

(56) References Cited

OTHER PUBLICATIONS

Ovidio M. Bucci et al. "Far-Field Pattern Determination from the Near-Field Amplitude on Two Surfaces", IEEE Transactions on Antennas and Propagation. vol. 38, No. II, Nov. 1990, pp. 1772-1779.
R. W. Gerchberg et al., "A Practical Algorithm for the Determination of Phase from Image and Diffraction Plane Pictures", OPTIK, vol. 35 (No. 2), 1972, pp. 237-246.

* cited by examiner

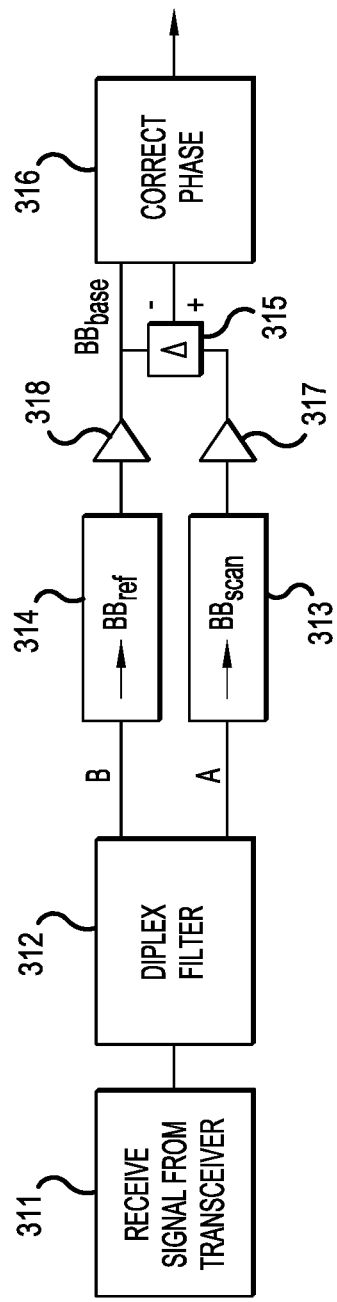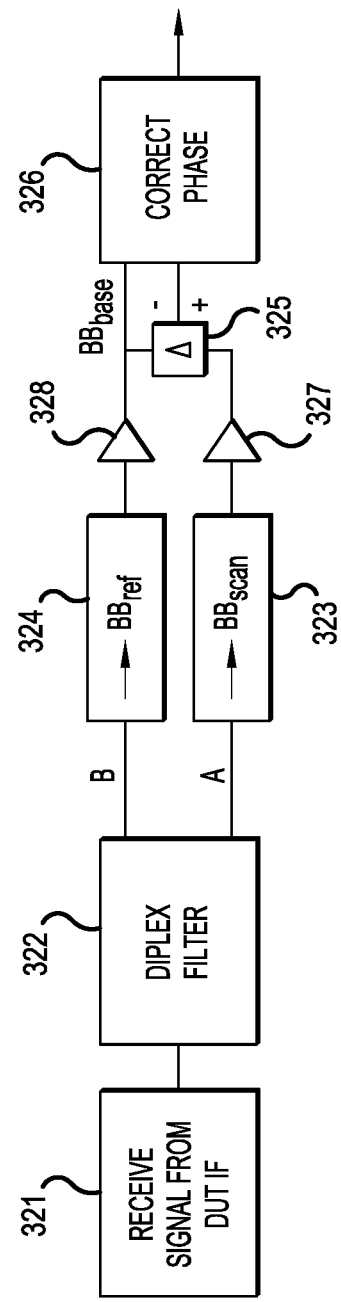

SYSTEM AND METHOD FOR NEAR FIELD TEST OF ACTIVE ANTENNA SYSTEM (ASS)TRANSCEIVER

BACKGROUND

Antenna arrays are increasingly used in electronic communications, including in the aerospace and the wireless telecommunications, for example. Antenna array test and calibration solutions are used to characterize the antenna arrays. Conventional solutions depend primarily on a vector network analyzer, which requires the device under test (DUT) including the antenna array, or antenna under test (AUT), to have radio frequency (RF) connectors, such as coaxial connectors, in order to perform the test and calibration. However, with the evolution of wireless communication technologies, antenna arrays with direct connections to (i.e., integrated with) RF transceivers of DUTs, and having no RF connectors, are becoming increasingly common. Overall performance of such a DUT presently must be tested "over-the-air," since there is no place to connect a coaxial cable from the DUT and/or the antenna array to the test equipment.

Antenna characterization processes typically take place either at an outdoor test range or a chamber test range. The outdoor test ranges are used for antennas having a very long far field (e.g., greater than 5 m), rendering use of a chamber impractical. Chambers are used for sufficiently short far field measurements and/or near field measurements. The chambers may be anechoic chambers, for example, which are shielded chambers with walls covered in absorbing material that minimizes internal reflections, typically by several tens of decibels. Making near field measurements and transforming to obtain the far field can provide the far field radiation profile information in a smaller chamber.

The next generation of wireless communication systems, including handsets and corresponding infrastructure (e.g., base stations and backbone) is referred to as fifth generation or "5G." 5G communication systems involve millimeter-wave frequency usage, compact phased array antennas, and significant electronic integration. Not only are transmitters and receivers of a DUT integrated into transceivers, but the transceivers are integrated with patch arrays, which have no traditional external connector from the radio electronics (e.g., handset or base station) to the transmit/receive (T/R) antenna. Instead, the entire radio, including antenna or antenna array, is a single indivisible unit referred to as an active antenna system (AAS). Of course, the AASs will still need testing for the usual characteristics, such as receiver sensitivity without and with interference present, total transmit power, error vector magnitude (EVM) of modulation formats, and antenna radiation pattern, for example. The parameters must be measured and studied in detail during product design phase, and characterization can be winnowed down during the manufacturing phase. However, the speed, accuracy and efficiency of testing are important to keep costs down and remain competitive.

The integrated (non-separable) nature of an AAS renders traditional transceiver testing methods unworkable. Traditionally, the antenna is disconnected, and all receiver and transmitter tests are performed by connecting test equipment to the radio's external connector. However, now there is no such connector on an AAS, as mentioned above. Further, the integrated nature of the 5G antenna introduces new challenges in testing the antenna itself. Conventional far field test chambers are large and expensive, so compact antenna test solutions, such as near field testing, are desirable.

However, to apply Fourier transform methods to convert near field measurement data to far field radiation patterns, both amplitude and phase information are needed in the near field sampling. When the antenna can be disconnected, as in conventional systems, this is straightforward to achieve. That is, one can simply use a 2-port network analyzer with the AUT as Port 1 and a calibrated antenna or horn as Port 2. However, when the AUT is inseparable from the transceiver, phase information can be unreliable because the phase of the DUT's local oscillator (LO) is likely to drift relative to the phase of the test equipment's LO.

The speed of testing may also become an issue, which is not adequately addressed by proposed over-the-air (OTA) test solutions, for example, many of which involve mechanical scanning over two or more degrees of rotational freedom. For example, in conventional near field testing of non-AAS DUTs, a probe is raster scanned over X and Y degrees of freedom, which is already a slow process. When the DUT is an AAS, this method does not by itself produce reliable phase information, due to the LO phase drift, mentioned above. One may attempt so-called phaseless measurements by raster scanning in a parallel offset X-Y plane, and then using iterative algorithms, such as the Gerchberg-Saxton algorithm, to process amplitude information from the two planes, respectively, and infer the phase. However, this procedure more than doubles measurement time because the probe must be Z-translated to the new offset X-Y plane, and performance of the algorithm itself can take a long time to converge.

In conventional far field testing, the DUT must still be gimbaled over azimuth and elevation degrees of freedom, not over X and Y translation degrees of freedom. This rotational motion and its control are complicated, and may be even slower than the X-Y plane translation. In addition, parallel acquisition speedup by using multiple probe horns may not be straightforward. For example, if N horns are acquiring signals simultaneously, then when scanning a plane or a cylinder, there is a speed-up factor of N. But, when scanning a sphere (which is the desired far field geometry), one encounters redundant azimuth-elevation coordinate access. Thus, the speed-up factor is less than N.

With the advent of 5-bit to 6-bit amplitude and phase control of every antenna element in a DUT's patch array, the variety of possible radiation patterns for a 5G design is enormous. Multiply this by the number of carrier frequencies for testing, multiply again by 2× for both polarizations to test, and one has an enormous amount of data to acquire in order to test the DUT. Thus, it presently may take eight or more hours to test a single DUT array using conventional means.

Accordingly, there is a need for a large speed-up factor for obtaining far field measurements of DUTs with integrated antenna arrays, including phase correction.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

FIG. 3A is a simplified functional block diagram showing signal processing for sorting reference and scanned signals and applying phase correction, in a DUT transmit test using a single transceiver, according to a representative embodiment.

FIG. 3B is a simplified functional block diagram showing signal processing for sorting reference and scanned signals and applying phase correction, in a DUT receive test using a single transceiver, according to a representative embodiment.

DETAILED DESCRIPTION

Figure 1:
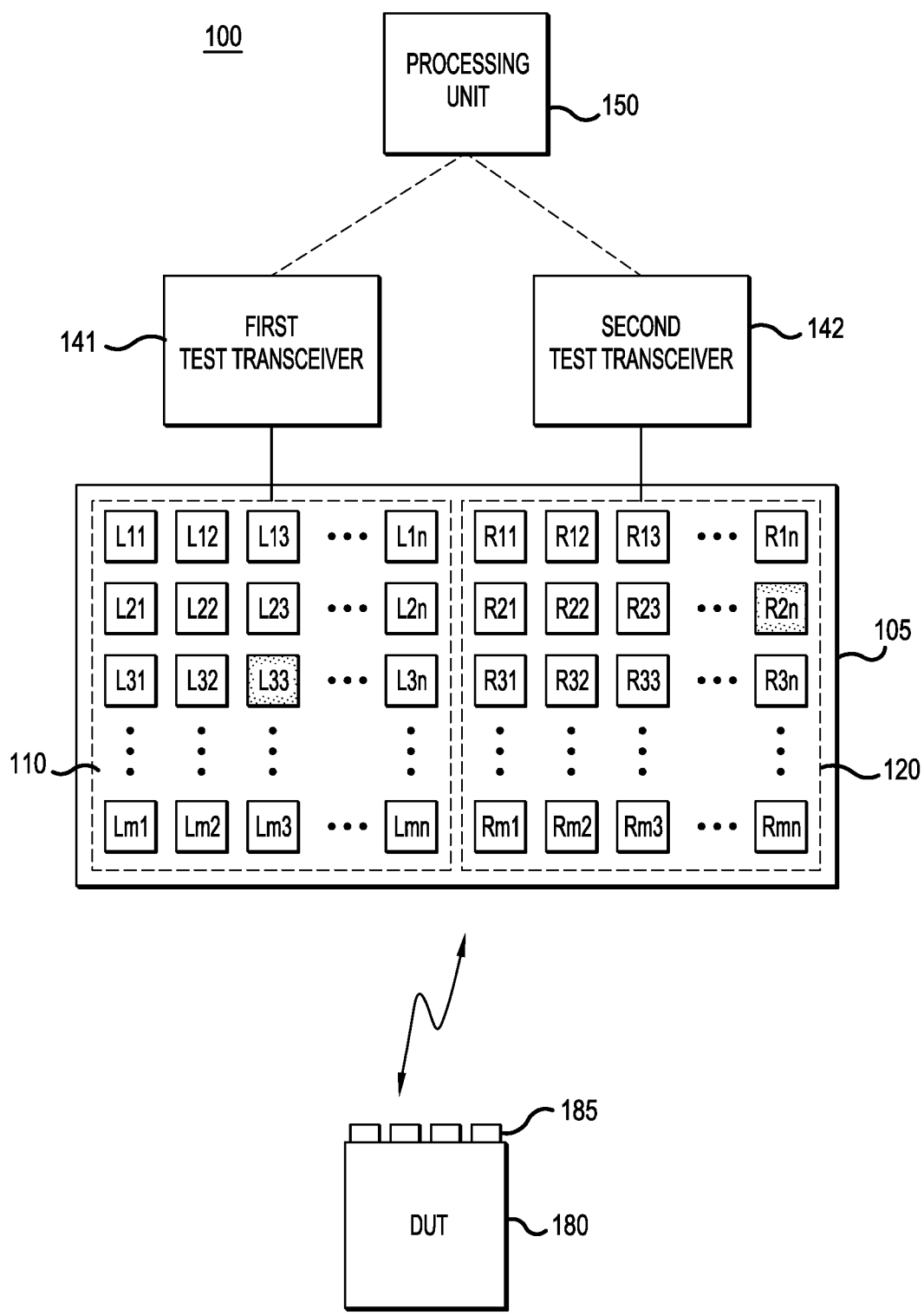
FIG. 1 is a simplified block diagram of a test system for testing a device under test (DUT), including an integrated antenna array, using multiple transceivers, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, according to various embodiments, complete far field characterization of a device under test (DUT) with an integrated antenna array (e.g. transmit and receive chains included), referred to as an antenna under test (AUT), may be made quickly and efficiently, e.g., using a (anechoic) chamber. The DUT with the integrated AUT may be referred to as active antenna system (AAS), as discussed above, and may be referred to interchangeably herein. More particularly, the embodiments include an all-electronic method using a test system for rapid testing of the AAS DUT. The test system may include a two-dimensional (2D) scanning array of probe antennas placed in the near field of the AAS DUT. The probe antennas of the AUT are dense in the electromagnetic sense, meaning they are spaced about half a wavelength apart in both planar directions.

According to the various embodiments, the 2D scanning array is divided into two portions, consisting of a left portion and a right portion. It is understood that the division into the left and right portions is conceptual (as opposed an actual physical separation), meaning that each of the probe antennas will be associated with either the left portion or the right portion of the 2D scanning array, e.g., based on corresponding locations of the probe antennas within the 2D scanning array. For purposes of discussion, it will be assumed that the two portions are equal halves of the scanning array, and thus have equal numbers of probe antennas. The left portion array will map the left portion of the DUT near field and the right portion array will map the right portion of the DUT near field, respectively.

As stated above, when the AUT is inseparable from the associated transceiver portion of the DUT, the phase information collected by a single channel of the test system may be rendered meaningless due to the inevitable phase drift between the local oscillator (LO) of the DUT and the LO of the test system. When the DUT LO coherence time is short, even while switching from one probe antenna to a neighboring probe antenna, the probe-to-probe relative phase is unreliable. Thus, according to various embodiments, two probe antennas are selected simultaneously in the scanning array, respectively referred to as the reference probe antenna and the actively scanned probe antenna. Scanning is alternated between the right portion while picking and fixing a reference element in the left portion half, and scanning the left portion while picking and fixing a reference element from the right portion. The actively scanned signal and the reference signal may be handled by two test transceivers, respectively, or in an alternative embodiment, the actively scanned signal and the reference signal may be superposed upon each other through a common path, so that a single test transceiver can be used (saving cost because transceivers suitable for handling 5G protocols are quite expensive).

Thus, according to a representative embodiment, a system is provided for testing a DUT in a near field, the DUT having an AAS transceiver with an LO. The system includes a scanning array having multiple probe antennas, the scanning array being divided into a first partial scanning array with first probe antennas of the multiple probe antennas and a second partial scanning array with second probe antennas of the multiple probe antennas, where the first partial scanning array is for determining a first portion of a near field pattern of the DUT and the second partial scanning array is for determining a second portion of the near field pattern of the DUT. The system further includes at least one test transceiver configured to transmit a transmit RF signal to the DUT via the scanning array while testing the DUT in a receive mode and/or to receive a receive RF signal from the DUT via the scanning array while testing the DUT in a transmit mode, and a processing unit. The processing unit is programmed to select a first reference probe antenna from among the first probe antennas in the first partial scanning array and a second reference probe antenna from among the second probe antennas in the second partial scanning array, the first reference probe antenna providing a first reference signal and the second reference probe antenna providing a second reference signal, to alternate between (i) consecutively scanning first signals from the first probe antennas in the first partial scanning array and comparing the scanned first signals to the second reference signal, respectively, and (ii) consecutively scanning second signals from the second probe antennas in the second partial scanning array and comparing the scanned second signals to the first reference signal, respectively, and to determine a phase drift of the DUT LO based on the comparing of the scanned first signals to the second reference signal and the comparing of the scanned second signals to the first reference signal.

According to another representative embodiment, a method is provided for testing a DUT in a near field, the DUT having an AAS transceiver with an LO. The method includes selecting a first reference probe antenna from among multiple first probe antennas in a first partial scanning array of a test system scanning array positioned in the near field of the DUT, the first reference probe antenna providing a first reference signal; selecting a second reference probe antenna from among multiple second probe antennas in a second partial scanning array of the test system scanning array positioned in the near field of the DUT, the second reference probe antenna providing a second reference signal; consecutively scanning second signals from the second probe antennas in the second partial scanning array and comparing each of the scanned second signals to the first reference signal to determine first corresponding phase differences; consecutively scanning first signals from the first probe antennas in the first partial scanning array and comparing each of the scanned first signals to the second reference signal to determine second corresponding phase differences; and determining a phase drift of the DUT LO based on the first and second determined corresponding phase differences.

FIG. 1 is a simplified block diagram of a test system for testing a device under test (DUT), including an integrated antenna array, according to a representative embodiment.

Referring to FIG. 1, test system 100 is configured to test DUT 180, which includes, for example, an integrated antenna array, referred to herein as AUT 185. The AUT 185 is integrated with the DUT 180 in that the transmit and receive chains (not shown) of the DUT 180 are combined directly with the AUT 185, as opposed to the AUT 185 being a separate and independently measurable antenna system, as discussed above. That is, the AUT 185 is inseparable from associated transceiver portion of the DUT 180. The DUT 180 therefore is an AAS transceiver. Because the AUT 185 is integrated with the DUT 180, the AUT 185 cannot be tested in isolation, and characterization of the DUT 180 and the AUT 185 is therefore performed at the same time. Each of the test system 100 and the DUT 180 include a corresponding LO (not shown). The phase of the LO of the DUT 180 (DUT LO) drifts relative to the phase of the LO of the test system 100 (test system LO) over the course of testing. The drifting of DUT LO phase is corrected by the test system 100 in order to provide accurate results.

In the depicted embodiment, the test system 100 includes a scanning array 105 comprising multiple probe antennas, discussed below, for receiving radio frequency (RF) signals transmitted from the DUT 180 during a DUT transmit test (where the DUT is in transmit mode), and for transmitting RF signals to the DUT 180 during a DUT receive test (where the DUT is in receive mode). The scanning array 105 is divided into a first (left) partial scanning array 110 and a second (right) partial scanning array 120, adjacent to one another. In the depicted embodiment, the first partial scanning array 110 includes first probe antennas L11 to Lmn arranged in a matrix-type array format, and the second partial scanning array 120 includes second probe antennas R11 to Rmn also arranged in a matrix-type array format, where m and n are positive integers which may or may not be equal to one another. For purposes of illustration, the first and second partial scanning arrays 110 and 120 each include half of the probe antennas of the scanning array (L11 to Lmn and R11 to Rmn, respectively), although the first and second partial scanning arrays 110 and 120 may include different numbers of probe antennas, without departing from the scope of the present teachings. That is, the first and second partial scanning arrays 110 and 120 may include various numbers and arrangements of probe antennas to provide unique benefits for any particular situation or to meet application specific design requirements of various implementations, as would be apparent to one skilled in the art.

The scanning array 105 is located in a near field of the DUT 180. Also, both the scanning array 105 and the DUT 180 may be inside a test chamber (not shown), such as an anechoic chamber, for better control of test conditions. The first probe antennas L11 to Lmn are grouped on the left side of the scanning array 105, and the second probe antennas R11 to Rmn are grouped on the right side of the scanning array 105. Therefore, the first partial scanning array 110 is used to determine a first (left) portion of a near field pattern of the AUT 185, and the second partial scanning array 120 is used to determine a second (right) portion of the near field pattern of the AUT 185.

In the depicted embodiment, the test system 100 further includes a first test transceiver 141 and a second test transceiver 142. The first test transceiver 141 is configured to receive an RF signal from the DUT 180 via the first partial scanning array 110, and the second test transceiver 142 is configured to receive an RF signal from the DUT 180 via the second partial scanning array 120, while testing the DUT 180 during a DUT transmit test. In addition, the first test transceiver 141 is configured to transmit an RF signal to the DUT 180 via the first partial scanning array 110, and the second test transceiver 142 is configured to transmit the RF signal to the DUT 180 via the second partial scanning array 120, while testing the DUT 180 during a DUT receive test. The RF signals transmitted by the first and second test transceivers 141 and 142 are substantially the same, so that uniform measurement results are obtained over the entire scanning array 105.

The test system 100 also includes a processing unit 150, which may be a digital signal processor (DSP), for example, that controls overall operations. The dashed lines indicated communication links between the processing unit 150 and each of the first and second test transceivers 141 and 142. The communication links may be wired or wireless, without departing from the scope of the present teachings.

In the depicted embodiment, the processing unit 150 is programmed to select a first reference probe antenna from among the first probe antennas L11 to Lmn in the first partial scanning array 110 and a second reference probe antenna from among the second probe antennas R11 to Rmn in the second partial scanning array 120. For purposes of illustration, the first reference probe antenna is first probe antenna L33, and the second reference probe antenna is second probe antenna R2n, although any of the first probe antennas L11 to Lmn may be selected as the first reference probe antenna and any one of the second probe antennas R11 to Rmn may be selected as the second reference probe antenna, e.g., depending on corresponding signal characteristics, without departing from the scope of the present teachings. Also, different first and second reference probe antennas may be selected for testing different DUTs. Likewise, different first and second reference probe antennas may be selected when the same DUT is driven with a different amplitude distribution.

The selected first reference probe antenna L33 provides a first reference signal and the selected second reference probe antenna R2n provides a second reference signal used for comparison to scanned signals, as discussed below, during the process of testing the DUT 180. The first reference signal and/or the second reference signal may be provided simultaneously with the scanned signals. The first and second reference signals may be pilot tones, for example. The scanning signals may be continuous wave (CW) signals, e.g., for determining far field pattern versus frequency, or complex modulation signals, e.g., for actual 5G system testing, for example.

Determining reliable first and second reference probe antenna positions for the first and second reference signals, respectively, may be based on signal strength and/or signal-to-noise ratio (SNR). For example, before raster scanning the active one of the first partial scanning array 110 or the second partial scanning array 120, a pre-scan is performed to find a strong signal (e.g., the highest signal strength and/or SNR) from among the signals provided by the probe antennas in the inactive (outside of the scanned portion) one of the first partial scanning array 110 or the second partial scanning array 120. For example, the processing unit 150 may select the first reference probe antenna by performing a pre-scan of the first partial scanning array 110 and identifying one of the first probe antennas as having a strong signal compared to the other first probe antennas, and may select the second reference probe antenna by performing a pre-scan of the second partial scanning array 120 and identifying one of the second probe antennas as having a strong signal compared to the other second probe antennas. Phase is irrelevant at this stage, when only searching for strongest signal. This preliminary step guarantees a reference SNR of the first or second reference signal greater than unity, ensuring that the phase extracted from this first or second reference signal is meaningful, rather than just random noise.

The processing unit 150 is further programmed to alternate between consecutively scanning signals from the first and second partial scanning arrays 110 and 120, and comparing each of the scanned signals from the first partial scanning array 110 to the second reference signal and comparing each of the scanned signals from the second partial scanning array 120 to the first reference signal, to gather relative phase information. More particularly, the processing unit 150 causes the first test transceiver 141 to consecutively scan the first signals from the first probe antennas L11 to Lmn (including the first reference probe antenna L33) and the second test transceiver 142 to continuously receive the second reference signal from the second reference probe antenna R2n. The scanning array 105 also includes known RF multi-throw switches (not shown) that are controlled to consecutively select one of the first probe antennas L11 to Lmn for scanning, and one of the second probe antennas R11 to Rmn for scanning, as well as to select the first reference probe antenna L33 or the second reference probe antenna R2n depending on which of the first or second partial scanning arrays 110 or 120 is being scanned.

The processing unit 150 alternates between receiving the scanned signal data from the first partial scanning array 110 and the second partial scanning array 120 at least once. For example, the processing unit 150 may alternate between the first and second partial scanning arrays 110 and 120 a predetermined number of times (one or more times), or until a predetermined threshold is met with respect to determining and correcting phase error.

The processing unit 150 receives first scanned signal data corresponding to the consecutively scanned first signals from the first test transceiver 141 and second reference data corresponding to the second reference signal from the second test transceiver 142, and individually compares the first scanned signal data corresponding to each of the consecutively scanned first signals with the second reference data, e.g., to collect relative phase information. The processing unit 150 then receives second scanned signal data corresponding to the consecutively scanned second signals from the second test transceiver 142 and first reference data corresponding to the first reference signal from the first test transceiver 141, and individually compares the second scanned signal data corresponding to each of the consecutively scanned second signals with the first reference data, e.g., to collect relative phase information. The first and second reference data effectively provide templates of the LO drift, so the relative phase (scan phase versus reference phase) remains faithful to the near field x-y phase distribution of the AUT 185.

Based on the collected relative phase information, the processing unit 150 is able to determine a phase drift of the DUT LO that occurs during the testing process. Once the phase drift of the DUT LO has been determined, the processing unit 150 is able to work with the relative phase information to auto-correct for the phase drift with respect to the first and second scanned signal data. After correcting for phase drift, the first and second scanned signal data are stitched by the processing unit 150 using one of the first reference probe antenna L33 or the second reference probe antenna R2n, selected by the processing unit 150, as a stitching point as discussed below.

In various embodiments, the processing unit 150 may be implemented by a computer processor, a DSP, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system.

A memory and/or storage device (not shown) in communication with the processing unit 150 may be implemented by any number, type and combination of random access memory (RAM) and read-only memory (ROM), for example. The memory and/or storage device may store various types of information, such as computer programs and software algorithms executable by the processing unit 150 (and/or other components), as well as raw data and/or measurement data storage, such as first and second scanned signal data and reference data, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory propagating signals).

Figure 2:
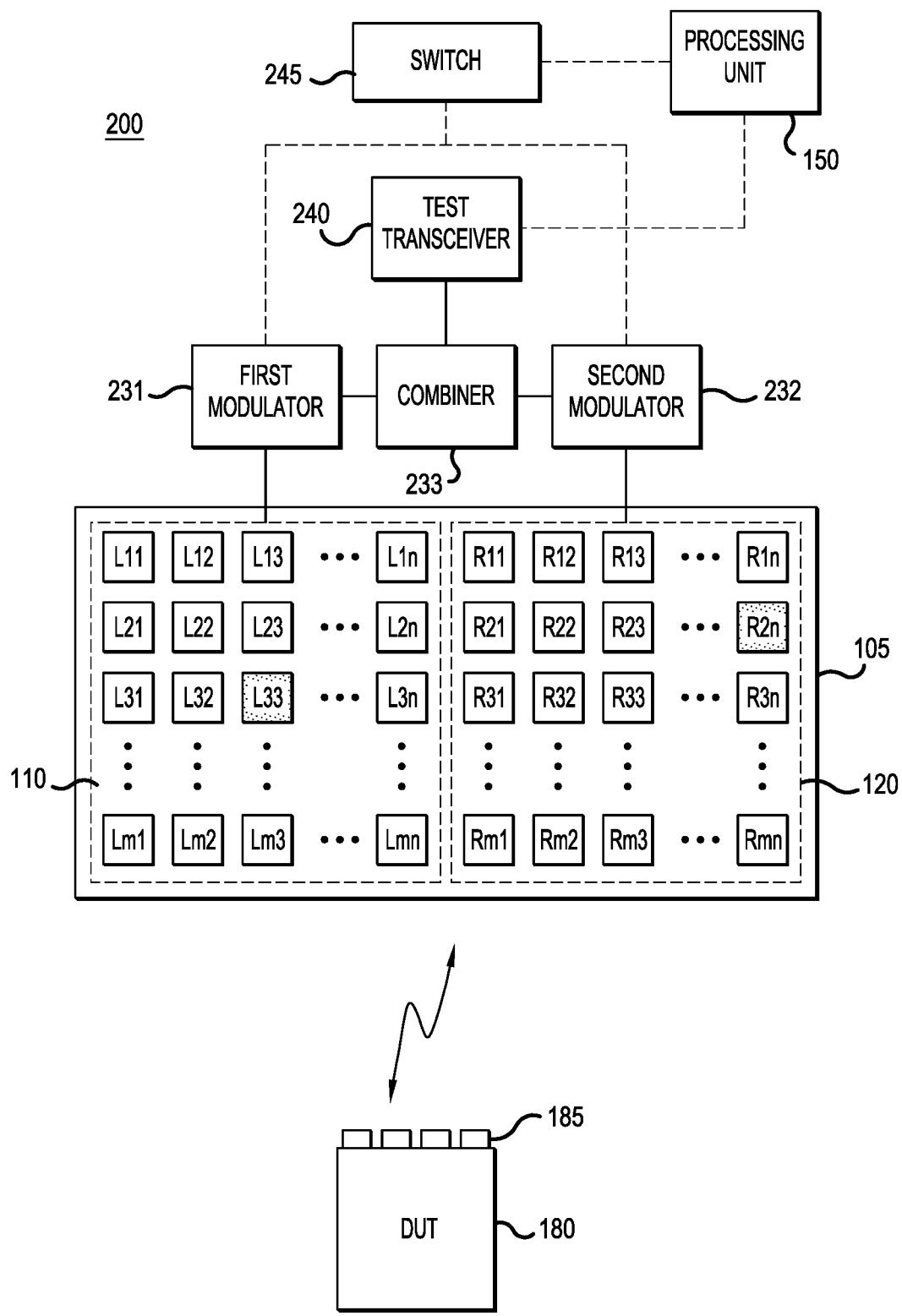
FIG. 2 is a simplified block diagram of a test system for testing a DUT, including an integrated antenna array, using a single transceiver, according to a representative embodiment.

FIG. 2 is a simplified block diagram of a test system for testing a DUT, including an integrated antenna array, using a single transceiver, according to a representative embodiment.

Referring to FIG. 2, test system 200 is configured to test the DUT 180, which includes, for example, the AUT 185. The AUT 185 is integrated with the DUT 180 in that the transmit and receive chains (not shown) of the DUT 180 are combined directly with the AUT 185, as opposed to the AUT 185 being a separate and independently measurable antenna system, as discussed above. The DUT 180 therefore is an AAS transceiver. Each of the test system 200 and the DUT 180 include a corresponding LO (not shown). The phase of the DUT LO drifts relative to the phase of the test system LO over the course of testing, and the test system 200 determines the amount of drift and corrects for the corresponding affects on testing the AUT 185.

In the depicted embodiment, the test system 200 includes scanning array 105, which is divided into the first (left) partial scanning array 110 and the second (right) partial scanning array 120, adjacent to one another, as discussed above. The first partial scanning array 110 includes first probe antennas L11 to Lmn arranged in a matrix-type array format, and the second partial scanning array 120 includes second probe antennas R11 to Rmn also arranged in a matrix-type array format, where m and n are positive integers which may or may not be equal to one another. For purposes of illustration, the first and second partial scanning arrays 110 and 120 each include half of the probe antennas of the scanning array (L11 to Lmn and R11 to Rmn, respectively), although the first and second partial scanning arrays 110 and 120 may include different numbers of probe antennas, without departing from the scope of the present teachings. Both the scanning array 105 and the DUT 180 may be inside a test chamber (not shown), such as an anechoic chamber, for better control of test conditions.

In the depicted embodiment, the test system 200 further includes a single test transceiver 240, which is configured to receive an RF signal from the DUT 180 alternately via the first partial scanning array 110 and the second partial scanning array 120, while testing the DUT 180 during a DUT transmit test. In addition, the test transceiver 240 is configured to transmit an RF signal to the DUT 180 alternately via the first partial scanning array 110 and the second partial scanning array 120, while testing the DUT 180 during a DUT receive test. The processing unit 150 controls selection of the first partial scanning array 110 and the second partial scanning array 120 in the receive and transmit modes through operation of a switch 245.

As discussed above, the processing unit 150 is programmed to select a first reference probe antenna from among the first probe antennas L11 to Lmn in the first partial scanning array 110 and a second reference probe antenna from among the second probe antennas R11 to Rmn in the second partial scanning array 120. Again, for purposes of illustration, the first reference probe antenna is first probe antenna L33, and the second reference probe antenna is second probe antenna R2n, although any one of the first probe antennas L11 to Lmn may be selected as the first reference probe antenna and any one of the second probe antennas R11 to Rmn may be selected as the second reference probe antenna, without departing from the scope of the present teachings. The first reference probe antenna L33 provides the first reference signal and the second reference probe antenna R2n provides the second reference signal used for comparison to scanned signals during the process of testing the DUT 180. The first reference signal is transmitted simultaneously with the scanned signals of the second partial scanning array 120, and the second reference signal is transmitted simultaneously with the scanned signals of the first partial scanning array 110.

The processing unit 150 is further programmed to alternate between consecutively scanning signals from the first and second partial scanning arrays 110 and 120, and comparing each of the scanned signals from the first partial scanning array 110 to the second reference signal and comparing each of the scanned signals from the second partial scanning array 120 to the first reference signal, to gather relative phase information. However, the single test transceiver 240 must be used to receive both the scanned signals and the reference signal from the different first and second partial scanning arrays 110 and 120, respectively.

Accordingly, the test system 200 further includes a first modulator 231, a second modulator 232, and a combiner 233, as well as the switch 245, mentioned above. The first modulator 231 is connected to the first partial scanning array 110, and the second modulator 232 is connected to the second partial scanning array 120. Each of the first and second modulators 231 and 232 may comprise a single-pole, single-throw switch, for example, to switch between a modulation state and a "through" state, discussed below. The combiner 233 is connected to both of the first and second modulators 231 and 232, and the test transceiver 240. The combiner 233 therefore is able to combine incoming RF signals from the first and second partial scanning arrays 110 and 120 to input to the test transceiver 240 when it is acting as a receiver, and to split outgoing RF signals from the test transceiver 240 when it is acting as a transmitter between the first and second modulators 231 and 232.

That is, during the DUT transmit test, the test transceiver 240 acts as a receiver, and the combiner 230 combines the reference signal from one of the first or second partial scanning arrays 110 and 120 and a scanned signal from the other of the first or second partial scanning arrays 110 and 120. During the DUT receive test, the test transceiver 240 acts as a transmitter, and the combiner 230 splits the RF signal transmission into the two portions, respectively transmitted from the first and second partial scanning arrays 110 and 120. Accordingly, the test transceiver 240 sends RF signals consecutively through the probe antennas L11 to Lmn or R11 to Rmn, and to the opposite one of the reference probe antennas L33 or R2n. The RF signals sent to the reference probe antennas L33 and R2n are modulated by the respective first and second modulators 231 and 232 to produce the pilot tones.

The first modulator 231 or the second modulator 232 switches to a modulation state to modulate RF signals only when the RF signals are reference signals, as opposed to actively scanned RF signals. When not switched to a modulation state, the first modulator 231 or the second modulator 232 is in a through state, acting as a "through" for the corresponding RF signals to and from the first partial scanning array 110 or the second partial scanning array 120, respectively. In the depicted embodiment, the switch 245 controls which of the first modulator 231 or the second modulator 232 is in the modulation state. For example, the processing unit 150 may operate the switch 245 to send a control signal to a selected one of the first modulator 231 or the second modulator 232 causing the selected one of the first modulator 231 or the second modulator 232 to switch to the modulation state, while the unselected one of the first modulator 231 or the second modulator 232 switches to (or remains in) the through state. In an alternative embodiment, the switch 245 may not be present, and the processing unit 150 may send control signals directly to the first and second modulators 231 and/or 232 to cause them to switch to one of the modulation state or the through state.

For example, when consecutively scanning signals from the first partial scanning array 110, the first modulator 231 may be switched to the through state (e.g., by operation of the switch 245) so that the actively scanned signals from the first probe antennas L11 to L*mn* pass through to the combiner 233, while the second modulator 232 may be switched to the modulation state (e.g., by operation of the switch 245) so that the second reference signal from the second reference probe antenna R2*n* is modulated. Each of the actively scanned signals from the first probe antennas L11 to L*mn* is superimposed on the modulated second reference signal by the combiner 233 and provided through a common path to the single test transceiver 240. Likewise, when consecutively scanning signals from the second partial scanning array 120, the second modulator 232 is switched to the through state (e.g., by operation of the switch 245) so that the actively scanned signals from the second probe antennas R11 to R*mn* pass through to the combiner 233, while the first modulator 231 is switched to the modulation state (e.g., by operation of the switch 245) so that the first reference signal from the first reference probe antenna L33 is modulated. Each of the actively scanned second signals from the second probe antennas R11 to R*mn* is superimposed on the modulated first reference signal by the combiner 233 and provided through the common path to the single test transceiver 240. As discussed above, the switch 245 may switch between the first and second modulators 231 and 232 under control of the processing unit 150, thereby selecting one of the first and second modulators 231 and 232 to be in the modulation state and the other to be in the through state.

The processing unit 150 receives the combined scanned first signal data corresponding to the consecutively scanned first signals and second reference data corresponding to the second reference signal from the test transceiver 240, and individually compares the scanned first signal data corresponding to each of the consecutively scanned first signals with the second reference data to collect relative phase information. The processing unit 150 then receives scanned second signal data corresponding to the consecutively scanned second signals and first reference data corresponding to the first reference signal from the test transceiver 240, and individually compares the scanned second signal data corresponding to each of the consecutively scanned second signals with the first reference data to collect relative phase information.

Based on these determined phase differences (relative phase information), the processing unit 150 determines a phase drift of the DUT LO that occurs during the testing process. Once the phase drift of the DUT LO has been determined, the processing unit 150 is able to correct for the phase drift, as discussed above. The processing unit 150 alternates between receiving the scanned signal data from the first partial scanning array 110 and the second partial scanning array at least one time. For example, the processing unit 150 may alternate between the first and second partial scanning arrays 110 and 120 a predetermined number of times, or until a predetermined threshold is met with respect to determining and correcting phase error.

FIG. 3A is a simplified functional block diagram showing signal processing for sorting reference and scanned signals and applying phase correction, during a DUT transmit test, using a single transceiver, according to a representative embodiment.

Referring to FIG. 3A, the test system 200 is performing a DUT transmit test. In block 311, the test transceiver 240 consecutively receives actively scanned RF signals and a reference signal from the scanning array 105. In an embodiment, the reference signal is AM modulated by one of the first modulator 231 and the second modulator 232. The AM modulation is at a modulation rate greater than the signal bandwidth (BW) of the DUT 180, and thus creates upper and lower sideband copies of the reference signal spectrum. The upper and lower sideband copies of the reference signal spectrum do not overlap the original DUT spectrum of the actively scanned RF signals.

In block 312, diplex filtering is performed by an analog or digital filter, for example, on the superposed actively scanned signal and reference signal provided by the combiner 233, where the superposed signal may be the algebraic sum of the actively scanned signal and the AM-modulated reference signal. The diplex filter has two complementary outputs: band pass and band stop. The respective filter responses of the two complementary outputs are essentially opposite copies of each other. The diplex filtering thereby creates two new output signals, filter scanned signal A and filtered reference signal B. The filtered scanned signal A is the resultant superposition of both the actively scanned and reference signals within the original DUT spectral footprint. The filtered reference signal B is the sideband-only content of the AM-modulated reference signal. If the diplex filter is simply a band pass/band stop filter that band passes the filtered scanned signal A, then the filtered reference signal B is available in double sideband (DSB), although the technique in FIG. 3A also works using a single sideband (SSB) of the filtered reference signal B by choosing either the upper or lower sideband. The SSB version rakes one copy of the modulation tones of the filtered reference signal B, while the DSB version rakes two copies. So, although the total information is the same, the DSB version typically provides a better signal-to-noise (SNR).

In an embodiment, the reference signal may be binary phase-shift keying (BPSK) modulated, which would displace the entire spectrum of the filtered reference signal outside the original spectrum of the DUT RF signals into upper and lower sidebands. In this case, the filtered scanned signal A only contains the scanned RF signals, already free of the reference signal, and the filtered reference signal B is available in the upper and/or lower sidebands.

In block 313, filtered scanned signal A is downconverted to baseband scanned signal ($BB_{scan}$), and in block 314, filtered reference signal B is downconverted to baseband reference signal ($BB_{ref}$), e.g., by mixing with the LO (not shown) of the test system 200. In the case of AM reference modulation of the reference signal by the first and/or second modulators 231 and 232, the baseband scanned signal $BB_{scan}$ is subtracted from the baseband reference signal $BB_{ref}$ indicated by block 315, after the reference components of the reference signals are amplitude-equalized by variable gain amplifiers (VGAs) in blocks 317 and 318, respectively. The relative gains may be determined by using a null active scan signal (no data scanned), and nulling the reference signal out of subtraction block 315. The resulting difference represents a bare baseband scanned signal $BB_{bare}$, where "bare" means that any reference signal dressing has been removed. Notably, for BPSK reference modulation, discussed above, the subtraction indicated by block 315 is unnecessary since the filtered scanned signal A is already free of the filtered reference signal B (and thus is a bare baseband scanned signal). Since any phase drift in the DUT LO is tracked by the baseband reference signal $BB_{ref}$, the baseband reference signal $BB_{ref}$ is used to phase-correct the bare baseband scanned signal $BB_{bare}$ in block 316. The phase correction may be accomplished, for example, by simply comparing time domain zero crossings between the bare baseband scanned signal $BB_{bare}$ and the baseband reference signal $BB_{ref}$, since these signals are essentially time-shifted replicas at this point.

FIG. 3B is a simplified functional block diagram showing signal processing for sorting reference and scanned signals and applying phase correction, in a DUT receive test, according to a representative embodiment. Notably, the signal processing flow shown in FIG. 3B is substantially the same as that shown in FIG. 3A after initial acquisition of the scanned and reference signals. That is, in the DUT receive test, the test transceiver 240 is transmitting (not shown in FIG. 3B) and the DUT 180 is receiving and provides its IF output to the test system 200, in the depicted example. The RF signals are sent to the DUT 180 as superposed pairs of scanned RF signals and a reference signal. Generally, the reference signal is at the same center frequency, but is more of a pilot tone(s). For example, in a straight forward implementation, using BPSK modulation of the reference signal, the reference signal has two tones on either side of a center frequency. Using AM of the reference signal, the reference signal has three tones: the two tones on either side of the center frequency and a tone at the center frequency itself.

More particularly, referring to FIG. 3B, in block 321, the DUT 180 outputs through its IF port consecutively received (and downconverted to IF) the actively scanned RF signals and a reference signal from the scanning array 105. In an embodiment, the reference signal is AM modulated by one of the first modulator 231 and the second modulator 232 at a modulation rate greater than the signal BW of the DUT 180, thus creating upper and lower sideband copies of the reference signal spectrum that do not overlap the original DUT spectrum.

In block 322, diplex filtering is performed on the superposed actively scanned signal and reference signal. The diplex filtering thereby creates two new output signals, filter scanned signal A and filtered reference signal B. The filtered scanned signal A is the resultant superposition of both the actively scanned and reference signals within the original DUT spectral footprint. The filtered reference signal B is the sideband-only content of the AM-modulated reference signal. If the diplex filter is simply a band pass filter that band passes the filtered scanned signal A, then the filtered reference signal B is available in DSB, although the technique in FIG. 3B also works using SSB of the filtered reference signal B by choosing either the upper or lower sideband.

As discussed above, the reference signal may be BPSK modulated, which would displace the entire spectrum of the filtered reference signal outside the original spectrum of the DUT signals into upper and lower sidebands. In this case, the filtered scanned signal A only contains the scanned signals, already free of the reference signal, and the filtered reference signal B is available in the upper and/or lower sidebands.

In block 323, filtered scanned signal A is downconverted from IF to baseband scanned signal ($BB_{scan}$), and in block 324, filtered reference signal B is downconverted from IF to baseband reference signal ($BB_{ref}$), e.g., by mixing with the LO (not shown) of the test system 200. In the case of AM reference modulation of the reference signal by the first and/or second modulators 231 and 232, the baseband scanned signal $BB_{scan}$ is subtracted from the baseband reference signal $BB_{ref}$, indicated by block 325, after the reference components of the reference signals are amplitude-equalized by VGAs indicated by blocks 327 and 328, respectively. The relative gains may be determined by using a null active scan signal (no data scanned), and nulling the reference signal out of subtraction block 325. The resulting difference represents a bare baseband scanned signal $BB_{bare}$. For BPSK reference modulation, the subtraction indicated by block 325 is unnecessary since the filtered scanned signal A is already free of the filtered reference signal B (and thus is a bare baseband scanned signal). Since any phase drift in the DUT LO is tracked by the baseband reference signal $BB_{ref}$, the baseband reference signal $BB_{ref}$ is used to phase-correct the bare baseband scanned signal $BB_{bare}$ in block 326, as discussed above.

Notably, referring to the embodiment shown in FIG. 1, the entire signal processing flows shown in FIGS. 3A and 3B are not necessary since the scanned signals and the reference signals from the first and second partial scanning arrays 110 and 120 are received and/or transmitted by separate first and second test transceivers 141 and 142, respectively. Accordingly, the reference signal does not need to be separated from the scanned signal to enable performance of the phase correction. The reference signal and the scanned signal will still need to be downconverted to respective baseband signals, however.

After correcting for phase drift (in accordance with any of the representative embodiments shown in FIG. 1 through FIG. 3B, for example), the scanned first and second signal data are stitched by the processing unit 150 using one of the first reference probe antenna L33 or the second reference probe antenna R2n, selected by the processing unit 150, as the stitching point. Since global phase is arbitrary, one of the first reference probe antenna L33 or the second reference probe antenna R2n can simply be declared as the "zero" of global phase, and the phases of the signal data from the other probe antennas in the scanning array 105 are mathematically shifted accordingly.

For example, it may be assumed, for purposed of illustration, that the phase of the first reference data from the first reference probe antenna L33 is declared as the "zero" of global phase ($\varphi_{refL,c} \rightarrow 0$), where subscript "ref" stands for reference probe antenna, subscript "L" stands for left, and subscript "c" means corrected for DUT LO drift. Accordingly, with regard to the first (left) partial scanning array 110, the phases of the scanned first signal data from the first probe antennas L11 to Lmn are shifted as follows: $\varphi_{iL,jL,c} \rightarrow \varphi_{iL,jL,c} - \varphi_{refL,c}$, where subscripts i and j denote the corresponding probe antenna row and column indices. In the second (right) partial scanning array 120, the corrected phase of the second reference data from the second reference probe antenna R2n is $\varphi_{refR,c}$, and the corrected phases of the scanned second signal data from the second reference probe antennas R11 to Rmn (other than R2n) are $\varphi_{iR,jR,c}$.

The unstitched (and phase-corrected) scan phases $\varphi_{i,j,c}$ of the scanned second signal data are output by the signal processing shown in FIGS. 3A and 3B, for example. The corrected phase $\varphi_{refR,c}$ of the second reference data is likewise such an unstitched output phase when the second partial scanning array 120 is scanned and the first reference probe antenna L33 in the first partial scanning array 110 provides the fixed reference. (Likewise, the corrected phase $\varphi_{reflL,c}$ of the first reference data is the analogous unstitched output phase when the first partial scanning array 110 is scanned and the second reference probe antenna R2n in the second partial scanning array 120 provides the fixed reference.) Since the corrected phase $\varphi_{reflL,c}$ of the first reference data has been reset to zero in the present example (which is possible because of the irrelevance of global phase, mentioned above), consistency requires that (i) the corrected phase $\varphi_{reflL,c}$ reset to zero be subtracted from the corrected scan phases $\varphi_{iL,jL,c}$, in all the scanned first signal data from the scanned first probe antennas L11 to Lmn in the first partial scanning array 110, and (ii) the corrected phases $\varphi_{iR,jR,c}$ of the scanned second signal data from the second reference probe antennas R11 to Rmn be left as is since they are already corrected with respect to the first reference antenna L33 to which global phase zero has been assigned. Notably, the sum of the corrected phase $\varphi_{reflR,c}$ of the second reference data and the corrected phase $\varphi_{reflL,c}$ of the first reference data is equal to zero. Hence, an equivalent procedure is to add the corrected phase $\varphi_{reflR,c}$ to each of the corrected phases $\varphi_{iL,jL,c}$ to complete the stitching. Of course, if the second reference probe antenna R2n were declared as the "zero" of global phase ($\varphi_{reflR,c} \to 0$), the same procedure would be performed, reversing the roles of the scanned signal data and the reference data from the first and second partial scanning arrays 110 and 120.

The near field data produced by the test systems 100 and 200 are coherent and consistent, and apply to either continuous wave (CW) or modulated DUT signals. With regard to CW DUT signals, standard Fourier transform techniques may be used to produce far field radiation patterns. With regard to modulated DUT signals, the test systems 100 and 200 may be used in conjunction with predicting error vector magnitude (EVM), as well as other metrics of interest in 5G tests, as described for example in U.S. Pat. No. 9,893,819, to Lee et al. (issued Feb. 13, 2018, which is hereby incorporated by reference in its entirety.

Figure 4:
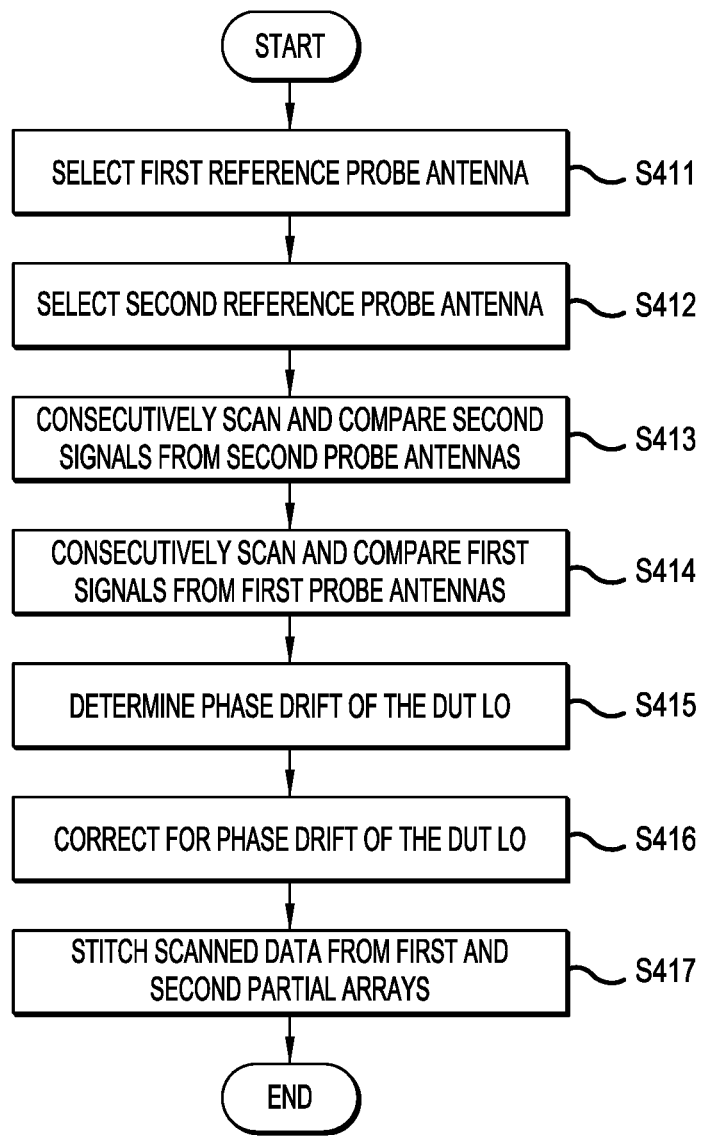
FIG. 4 is a simplified flow diagram of a method for testing a DUT, including an integrated antenna array, using multiple transceivers, according to a representative embodiment.

FIG. 4 is a simplified flow diagram of a method for testing a DUT, including an integrated antenna array, according to a representative embodiment.

Referring to FIG. 4, a method is provided for testing a DUT (e.g., DUT 180), having an integrated antenna array (e.g., AUT 185) in a near field. The DUT includes an AAS transceiver with a local oscillator (LO). The method is performed using a test system having at least one test transceiver, a scanning array of probe antennas divided into first and second partial scanning arrays, and a processing unit, as discussed above. The scanning array of the test system is positioned in the near field of the DUT. The method may be performed under control of the processing unit (e.g., processing unit 150).

According to the depicted embodiment, a first reference probe antenna is selected in block S411 from among multiple first probe antennas in the first partial scanning array of the test system scanning array. The selected first reference probe antenna is configured to provide a first reference signal. In block S412, a second reference probe antenna is selected from among multiple second probe antennas in the second partial scanning array. The second reference probe antenna is configured to provide a second reference signal.

In block S413, second signals from the second probe antennas in the second partial scanning array are consecutively scanned, and each of the consecutively scanned second signals is compared to the first reference signal provided by the selected first reference probe antenna to determine first corresponding phase differences. In block S414, first signals from the first probe antennas in the first partial scanning array are consecutively scanned, and each of the consecutively scanned first signals is compared to the second reference signal provided by the selected second reference probe antenna to determine second corresponding phase differences.

A phase drift of the DUT LO is determined in block S415 based on the first and second determined corresponding phase differences, and the determined phase drift is corrected for in block S416. In block S417, corrected scanned data from the first partial array and corrected scanned data from the second partial array are stitched to provide phase-corrected scanned data for the entire scanning array. The stitching may be performed by selecting one of the first or second reference probe antennas to be used as the stitching point. The phase of the corresponding first or second reference signal is declared as the zero of global phase, and the phases of the first and second scanned signals are mathematically shifted in accordance with the selected first or second reference probe antenna, as discussed above.

Figure 5:
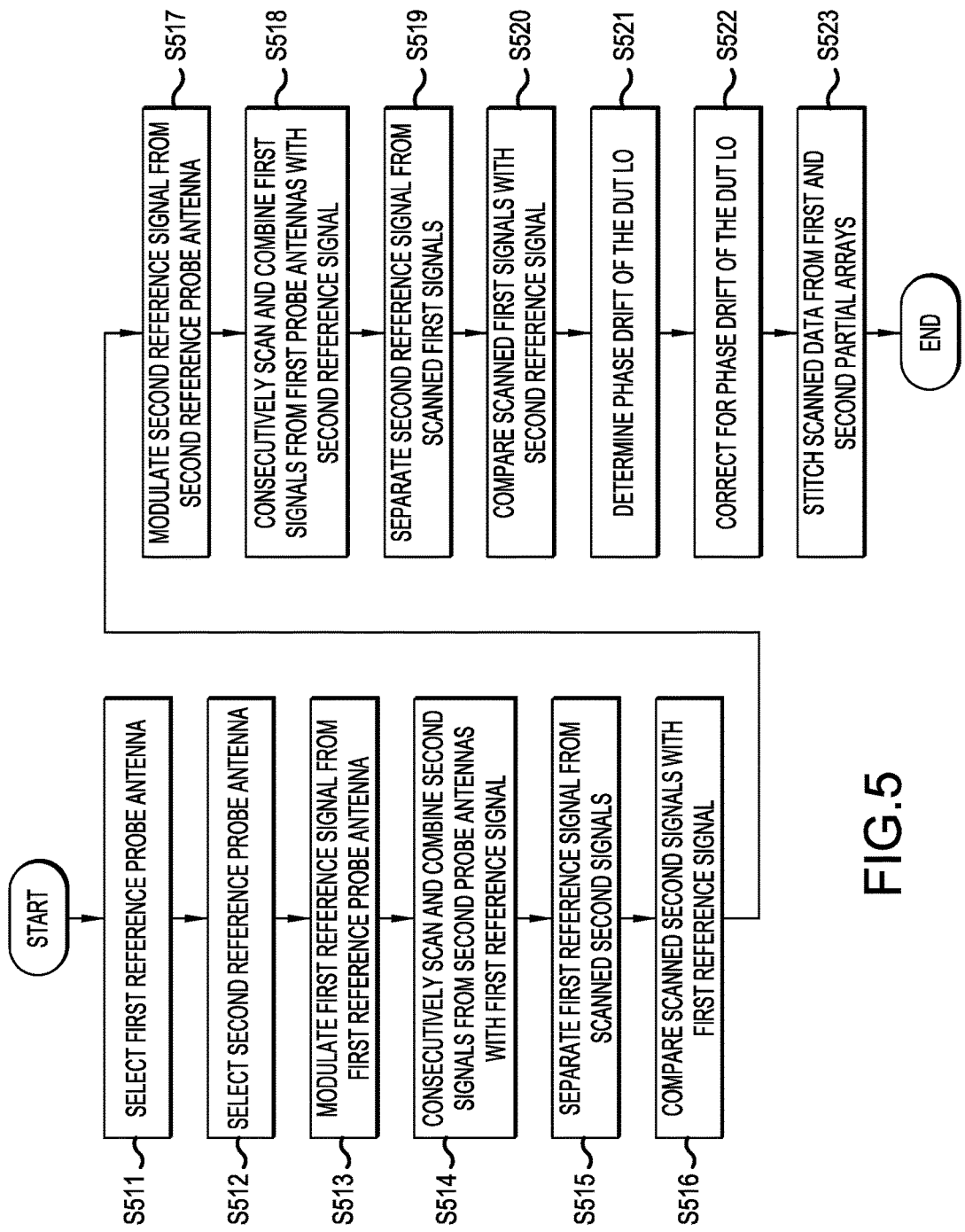
FIG. 5 is a simplified flow diagram of a method for testing a DUT, including an integrated antenna array, using a single test transceiver, according to a representative embodiment.

FIG. 5 is a simplified flow diagram of a method for testing a DUT, including an integrated antenna array, using a single test transceiver, according to a representative embodiment.

Referring to FIG. 5, a method is provided for transmit testing a DUT (e.g., DUT 180), having an integrated antenna array (e.g., AUT 185) in a near field, using a single test transceiver, where the input to and/or the output from the test transceiver is controlled by a switch (e.g., switch 245). The DUT includes an AAS transceiver with an LO. The test system further includes a scanning array of probe antennas divided into first and second partial scanning arrays, first and second modulators respectively connected to the first and second partial scanning arrays, a combiner connecting the first and second modulators to the single test transceiver, and a processing unit, as discussed above. The scanning array of the test system is positioned in the near field of the DUT. The method may be performed under control of a processing unit (e.g., processing unit 150).

According to the depicted embodiment, a first reference probe antenna is selected in block S511 from among multiple first probe antennas in the first partial scanning array of the test system scanning array. The selected first reference probe antenna is configured to provide a first reference signal (e.g., pilot tone(s)). In block S512, a second reference probe antenna is selected from among multiple second probe antennas in the second partial scanning array. The second reference probe antenna is configured to provide a second reference signal (e.g., pilot tone(s)).

The first reference signal from the selected first reference probe antenna in the first partial scanning array is modulated by the first modulator in block S513. In block S514, second signals from the second probe antennas in the second partial scanning array are consecutively scanned, and each of the consecutively scanned second signals is combined with the modulated first reference signal. After being received by the transceiver, for example, the first reference signal is separated from each of the scanned second signals in block S515, and the first reference signal and the scanned second signals are demodulated to base band respectively. In block S516, each of the consecutively scanned second signals is compared to the first reference signal provided by the selected first reference probe antenna to determine corresponding first phase differences.

The process is then essentially repeated using the second reference signal and consecutively scanned first signals. That is, the second reference signal from the selected second reference probe antenna in the second partial scanning array is modulated by the second modulator in block S517. In block S518, first signals from the first probe antennas in the first partial scanning array are consecutively scanned, and each of the consecutively scanned first signals is combined with the modulated second reference signal. After being received by the transceiver, for example, the second reference signal is separated from each of the scanned first signals in block S519, and the second reference signal and the scanned first signals are demodulated to base band respectively. In block S520, each of the consecutively scanned first signals is compared to the second reference signal provided by the selected second reference probe antenna to determine corresponding second phase differences.

A phase drift of the DUT LO is determined in block S521 based on the first and second determined corresponding phase differences, and the determined phase drift is corrected for in block S522. In block S523, corrected scanned data from the first partial array and corrected scanned data from the second partial array are stitched to provide phase-corrected scanned data for the entire scanning array, as discussed above.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A system for testing a device under test (DUT) in a near field, the DUT having an active antenna system (AAS) transceiver with a local oscillator (LO), the system comprising:
   a scanning array comprising a plurality of probe antennas, the scanning array being divided into a first partial scanning array comprising first probe antennas of the plurality of probe antennas and a second partial scanning array comprising second probe antennas of the plurality of probe antennas, wherein the first partial scanning array is for determining a first portion of a near field pattern of the DUT and the second partial scanning array is for determining a second portion of the near field pattern of the DUT;
   at least one test transceiver configured to transmit a transmit radio frequency (RF) signal to the DUT via the scanning array while testing the DUT in a receive mode and/or to receive a receive RF signal from the DUT via the scanning array while testing the DUT in a transmit mode; and
   a processing unit programmed to:
      select a first reference probe antenna from among the first probe antennas in the first partial scanning array and a second reference probe antenna from among the second probe antennas in the second partial scanning array, the first reference probe antenna providing a first reference signal and the second reference probe antenna providing a second reference signal,
      alternate between (i) consecutively scanning first signals from the first probe antennas in the first partial scanning array and comparing the scanned first signals to the second reference signal, respectively, and (ii) consecutively scanning second signals from the second probe antennas in the second partial scanning array and comparing the scanned second signals to the first reference signal, respectively, and
      determine a phase drift of the DUT LO based on the comparing of the scanned first signals to the second reference signal and the comparing of the scanned second signals to the first reference signal.

2. The system of claim 1, further comprising:
   at least one signal modulator configured to modulate the second reference signal while the first signals from the first probe antennas are being consecutively scanned, and to modulate the first reference signal while the second signals from the second probe antennas are being consecutively scanned.

3. The system of claim 1, wherein the processing unit is further programmed to phase correct the scanned first signals and the scanned second signals, providing phase-corrected first and second data corresponding to the phase-corrected first and second signals, respectively, that account for the determined phase drift of the DUT LO.

4. The system of claim 3, wherein the processing unit is further programmed to stitch the phase-corrected first and second data using one of the first reference probe antenna or the second reference probe antenna as a stitching point where phase is set to zero.

5. The system of claim 1, wherein the at least one test transceiver comprises:
   a first test transceiver configured to transmit the transmit RF signal to the DUT via the first partial scanning array during the testing of the DUT in the receive mode and/or to receive the receive RF signal from the DUT via the first partial scanning array during the testing of the DUT in the transmit mode; and
   a second test transceiver configured to configured to transmit the transmit RF signal to the DUT via the second partial scanning array during the testing of the DUT in the receive mode and/or to receive the receive RF signal from the DUT via the second partial scanning array during the testing of the DUT in the transmit mode.

6. The system of claim 2, wherein the at least one test transceiver comprises a single test transceiver, and wherein the at least one signal modulator comprises a first signal modulator configured to modulate the first reference signal while the second signals are being consecutively scanned, and a second signal modulator configured to modulate the second reference signal while the first signals are being consecutively scanned, the system further comprising:
   a combiner configured to combine each of the scanned first signals from the first probe antennas with the modulated second reference signal, and to combine each of the scanned second signals from the second probe antennas with the modulated first reference signal.

7. The system of claim 6, wherein each of the first and second signal modulators comprises a single-pole, single-throw switch.

8. The system of claim 6, wherein the at least one signal modulator uses AM modulation to modulate the first and second reference signals, the system further comprising:
   a diplexing filter configured to receive a combined signal from the single test transceiver for testing the DUT in the transmit mode, and to filter the combined signal into an original band and at least one side band,
   wherein the original band includes the scanned first signals or the scanned second signals and the second reference signal or the first reference signal, and the at least one side band includes the second reference signal or the first reference signal, respectively, wherein a difference between a baseband signal of the original band and a base band signal of the at least one side band provides a bare baseband signal corresponding to the scanned first signals or the scanned second signals without the first or second reference signal, and wherein phase is corrected by comparing the bare baseband signal with one of the first or second reference signal.

9. The system of claim 6, wherein the at least one signal modulator uses AM modulation to modulate the first and second reference signals, the system further comprising:

a diplexing filter configured to receive a combined signal originating as a downconverted RF signal from an IF output of the DUT for testing the DUT in the receive mode, and to filter the combined signal into an original band and at least one side band, wherein the original band includes the scanned first signals or the scanned second signals and the second reference signal or the first reference signal, and the at least one side band includes the second reference signal or the first reference signal, respectively, wherein a difference between a baseband signal of the original band and a base band signal of the at least one side band provides a bare baseband signal corresponding to the scanned first signals or the scanned second signals without the first or second reference signal, and wherein phase is corrected by comparing the bare baseband signal with one of the first reference signal or the second reference signal.

10. The system of claim 1, wherein the processing unit selects the first reference probe antenna by performing a pre-scan of the first partial scanning array and identifying one of the first probe antennas as having a strong signal compared to other first probe antennas, and wherein the processing unit selects the second reference probe antenna by performing a pre-scan of the second partial scanning array and identifying one of the second probe antennas as having a strong signal compared to other second probe antennas.

11. The system of claim 10, wherein the strong signal has a signal-to-noise ratio (SNR) greater than unity.

12. The system of claim 1, wherein in the second partial scanning array is adjacent to the first partial scanning array, and each of the first partial scanning array and the second partial scanning array is approximately half the scanning array of the system.

13. The system of claim 1, wherein the plurality of probe antennas are dense, being arranged about one half a wavelength of the transmit RF signal or the receive RF signal apart from one another in two planar directions.

14. The system of claim 1, wherein the processing unit comprises a digital signal processor (DSP).

15. The system of claim 2, wherein the at least one signal modulator uses AM modulation to modulate the first and second reference signals, the AM having a modulation rate greater than a bandwidth of each of the transmit RF signal and the receive RF signal.

16. The system of claim 2, wherein the at least one signal modulator uses binary phase-shift keying (BPSK) modulation to modulate the first and second reference signals.

17. The system of claim 1, wherein the processing unit is further configured to perform a fast Fourier transform on the first portion of the near field pattern and the second portion of the near field pattern to determine a far field pattern of the DUT.

18. A method for testing a device under test (DUT) in a near field, the DUT having an active antenna system (AAS) transceiver with a local oscillator (LO), the method comprising:

selecting a first reference probe antenna from among a plurality of first probe antennas in a first partial scanning array of a test system scanning array positioned in the near field of the DUT, the first reference probe antenna providing a first reference signal;

selecting a second reference probe antenna from among a plurality of second probe antennas in a second partial scanning array of the test system scanning array positioned in the near field of the DUT, the second reference probe antenna providing a second reference signal;

consecutively scanning second signals from the plurality of second probe antennas in the second partial scanning array and comparing each of the scanned second signals to the first reference signal to determine first corresponding phase differences;

consecutively scanning first signals from the plurality of first probe antennas in the first partial scanning array and comparing each of the scanned first signals to the second reference signal to determine second corresponding phase differences; and determining a phase drift of the DUT LO based on the first and second determined corresponding phase differences.

19. A system for testing a device under test (DUT) in a near field, the DUT having an active antenna system (AAS) transceiver with a local oscillator (LO), the system comprising:

a scanning array comprising a plurality of probe antennas, the scanning array being divided into a first partial scanning array comprising first probe antennas of the plurality of probe antennas and a second partial scanning array comprising second probe antennas of the plurality of probe antennas, wherein the first partial scanning array is for determining a first portion of a near field pattern of the DUT and the second partial scanning array is for determining a second portion of the near field pattern of the DUT;

a transceiver configured to transmit a transmit radio frequency (RF) signal to the DUT via the scanning array while testing the DUT in a receive mode and/or to receive a receive RF signal from the DUT via the scanning array while testing the DUT in a transmit mode;

a first signal modulator configured to modulate a first reference signal of the first partial scanning array while second signals of the second probe antennas in the second partial scanning array are being consecutively scanned;

a second signal modulator configured to modulate a second reference signal of the second partial scanning array while first signals of the first probe antennas in the first partial scanning array are being consecutively scanned;

a combiner configured to combine each of the scanned first signals with the modulated second reference signal, and to combine each of the scanned second signals with the modulated first reference signal; and a switch configured to alternately select one of the first signal modulator and the second signal modulator to modulate the first reference signal and the second reference signal, respectively.

20. The system of claim 19, further comprising a processing unit programmed to:

select a first reference probe antenna from among the first probe antennas in the first partial scanning array and a second reference probe antenna from among the second probe antennas in the second partial scanning array, the first reference probe antenna providing the first reference signal and the second reference probe antenna providing the second reference signal;

alternate between (i) consecutively scanning the first signals and comparing the scanned first signals to the second reference signal, respectively, and (ii) consecutively scanning the second signals and comparing the scanned second signals to the first reference signal, respectively, and determine a phase drift of the DUT LO based on the comparing of the scanned first signals to the second reference signal and the comparing of the scanned second signals to the first reference signal.

\* \* \* \* \*

UNITED STATES PATENT AND TRADEMARK OFFICE
CERTIFICATE OF CORRECTION

PATENT NO. : 10,505,275 B2  
APPLICATION NO. : 15/975523  
DATED : December 10, 2019  
INVENTOR(S) : Gregory S. Lee Page 1 of 1

It is certified that error appears in the above-identified patent and that said Letters Patent is hereby corrected as shown below:

On the Title Page

In item (54), in Column 1, in "Title", Line 3, and in the Specification, in Column 1, Line 3, delete "(ASS)" and insert -- (AAS) --, therefor.

Signed and Sealed this  
Twenty-fourth Day of March, 2020

Andrei Iancu  
*Director of the United States Patent and Trademark Office*